United States Patent
Choi (10) Patent No.: US 10,868,503 B2
(45) Date of Patent: Dec. 15, 2020

(54) POWER AMPLIFIER APPARATUS AND METHOD

(71) Applicant: Samsung Electro-Mechanics Co., Ltd., Suwon-si (KR)

(72) Inventor: Kyu Jin Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/997,832

(22) Filed: Jun. 5, 2018

(65) Prior Publication Data

US 2019/0068143 A1 Feb. 28, 2019

(30) Foreign Application Priority Data

Aug. 24, 2017 (KR) .................. 10-2017-0107428

(51) Int. Cl.
| | | |
|---|---|---|
| H03F 3/04 | (2006.01) | |
| H03F 3/24 | (2006.01) | |
| H03F 3/21 | (2006.01) | |
| H03F 1/02 | (2006.01) | |
| H03F 3/195 | (2006.01) | |
| H03F 1/32 | (2006.01) | |

(52) U.S. Cl.
CPC .......... H03F 3/245 (2013.01); H03F 1/0205 (2013.01); H03F 1/0261 (2013.01); H03F 1/32 (2013.01); H03F 3/195 (2013.01); H03F 3/211 (2013.01); *H03F 2200/451* (2013.01)

(58) Field of Classification Search
CPC ......... H03F 3/245; H03F 1/0261; H03F 1/32; H03F 3/195; H03F 1/0205; H03F 3/211; H03F 2200/451

USPC .................. 330/302, 310, 133, 285
See application file for complete search history.

(56) References Cited

U.S. PATENT DOCUMENTS

| | | | |
|---|---|---|---|
| 6,175,279 B1 * | 1/2001 | Ciccarelli | H04B 1/109 330/296 |
| 6,624,694 B2 | 9/2003 | Ma et al. | |
| 6,781,467 B2 * | 8/2004 | Sun | H03F 1/26 330/149 |
| 6,809,594 B2 * | 10/2004 | Sutardja | H03F 1/34 330/124 R |
| 6,900,693 B2 | 5/2005 | Sasho et al. | |

(Continued)

FOREIGN PATENT DOCUMENTS

| | | |
|---|---|---|
| KR | 10-0623062 B1 | 9/2006 |
| KR | 10-1722093 B1 | 4/2017 |

OTHER PUBLICATIONS

Korean Office Action dated Jul. 18, 2018 in Corresponding Korean Patent Application No. 10-2017-0107428 (7 pages in English, 6 pages in Korean).

*Primary Examiner* — Khanh V Nguyen
*Assistant Examiner* — Khiem D Nguyen
(74) *Attorney, Agent, or Firm* — NSIP Law (57) ABSTRACT

There is provided a power amplifier and an integrated circuit including the power amplifier. The power amplifier includes a first amplifier configured to amplify a first signal; a phase shifter configured to invert the first signal; and a harmonic sinker connected between an output terminal of the phase shifter and an output terminal of the first amplifier, configured to amplify an output signal of the phase shifter, and configured to have a conduction angle narrower than a conduction angle of the first amplifier.

20 Claims, 3 Drawing Sheets

(56) References Cited

U.S. PATENT DOCUMENTS

| | | | |
|---|---|---|---|
| 7,477,102 B1* | 1/2009 | Ellis | H03F 1/0244 |
| | | | 330/129 |
| 2005/0280472 A1* | 12/2005 | Revanna | H03F 1/26 |
| | | | 330/302 |
| 2007/0080750 A1* | 4/2007 | Liebenrood | H03F 1/0261 |
| | | | 330/252 |
| 2009/0184761 A1* | 7/2009 | Reynaert | H03F 1/56 |
| | | | 330/10 |
| 2013/0143510 A1 | 6/2013 | Lee et al. | |
| 2016/0013758 A1 | 1/2016 | Cao et al. | |
| 2017/0040958 A1 | 2/2017 | Cao et al. | |

* cited by examiner

POWER AMPLIFIER APPARATUS AND METHOD

CROSS-REFERENCE TO RELATED APPLICATION

This application claims the benefit under 35 USC 119(a) to Korean Patent Application No. 10-2017-0107428 filed on Aug. 24, 2017 in the Korean Intellectual Property Office, the disclosure of which is incorporated herein by reference for all purposes.

BACKGROUND

1. Field

This application relates to a power amplifier apparatus and method for amplifying a signal.

2. Description of the Related Art

Devices such as wireless terminals that have a function of transmitting signals to external devices, may include a power amplifier for amplifying signals to be transmitted to the external devices, and an integrated circuit that includes the power amplifier. The demand for factors such as band-broadening, improvements in linearity, and intellectualization, from power amplifiers, has increased in accordance with the trend of band-broadening, multimedization, intellectualization with regard to these devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power amplifier includes a first amplifier configured to amplify a first signal; a phase shifter configured to invert the first signal; and a harmonic sinker, connected between an output terminal of the phase shifter and an output terminal of the first amplifier, configured to amplify an output signal of the phase shifter, and configured to have a conduction angle narrower than a conduction angle of the first amplifier.

The first amplifier may be one of a class A amplifier and a class AB amplifier, and the first harmonic sinker may be one of a deep class AB amplifier, a class B amplifier, and a class C amplifier.

The power amplifier may include a second amplifier configured to amplify a signal from the output terminal of the first amplifier.

The phase shifter may be configured to invert a signal from an input terminal of the first amplifier; and the harmonic sinker may be configured to eliminate a signal having a desired harmonics component from an output signal of the first amplifier.

The power amplifier may further include a second amplifier configured to receive the first signal from the first amplifier, amplify the first signal, and output the amplified first signal as a second signal.

The first amplifier may include a first transistor that has a base to which the first signal is applied, an emitter connected to a ground, and a collector from which a second signal obtained by amplifying the first signal is output.

The harmonic sinker may include a second transistor that has a base to which an output signal of the phase shifter is applied and an emitter connected to a ground.

The first transistor shares a collector terminal with the second transistor.

The power amplifier may further include a first bias circuit configured to output a first bias current to an input terminal of the first amplifier; and a second bias circuit configured to operate independently of the first bias circuit and configured to output a second bias current to an input terminal of the harmonic sinker.

The power amplifier is an integrated circuit, and further comprises a signal generator to signal process an input signal to generate the first signal.

In another general aspect, an integrated circuit includes a signal generator configured to modulate a carrier signal based on a signal comprising information to be transmitted and output an input signal; and a power amplifier configured to amplify the input signal and output an output signal, and the power amplifier includes a first amplifier configured to amplify the input signal; a phase shifter configured to invert the input signal; and a harmonic sinker connected between an output terminal of the phase shifter and an output terminal of the first amplifier, configured to amplify an output signal of the phase shifter, and configured to have a conduction angle narrower than a conduction angle of the first amplifier.

The first amplifier may be one of a class A amplifier and a class AB amplifier, and the first harmonic sinker may be one of a deep class AB amplifier, a class B amplifier, and a class C amplifier.

The integrated circuit may include a second amplifier configured to amplify a signal from the output terminal of the first amplifier and output the output signal.

The phase shifter may be configured to invert a signal from an input terminal of the first amplifier; and the harmonic sinker is configured to eliminate a signal having a desired harmonics component from an output signal of the first amplifier.

The power amplifier may further include a second amplifier configured to receive the input signal from the first amplifier, amplify the input signal, and output the amplified input signal.

The first amplifier may include a first transistor that has a base to which the first signal is applied, an emitter connected to a ground, and a collector from which a second signal obtained by amplifying the first signal is output.

The harmonic sinker may include a second transistor that has a base to which an output signal of the phase shifter is applied, and an emitter connected to a ground, and sharing a collector with the first transistor.

In another general aspect, a power amplifying method includes generating a first amplified signal by amplifying a first signal with a first amplifier; changing a phase of the first amplified signal; generating a second amplified signal by amplifying the amplified first signal with a second amplifier; and harmonically sinking harmonics components of the second amplified signal.

Changing the phase of the first amplified signal includes inverting and outputting an output signal of the first amplifier.

The sinking of the harmonics components includes eliminating signals that have a predetermined component from the second amplified signal.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

Figure 1:
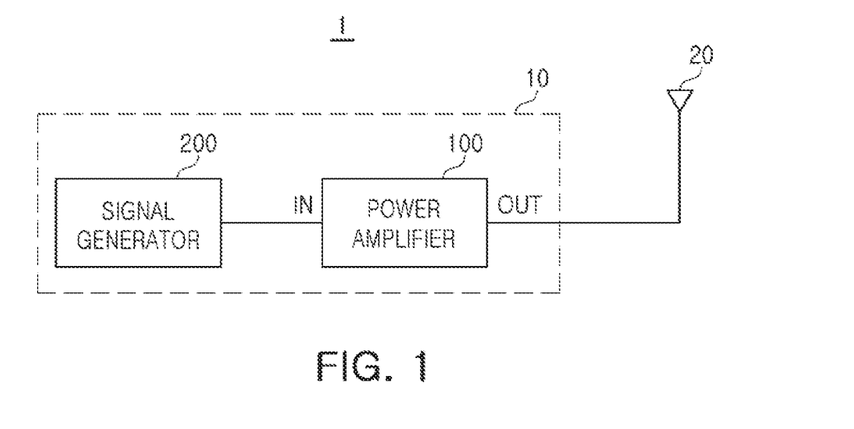
FIG. 1 is a diagram schematically illustrating an example of a device having an integrated circuit including a power amplifier according to the present disclosure.

FIG. 1 is a diagram schematically illustrating an example of a device 1 that has an integrated circuit 10 including a power amplifier 100 and an antenna 20, for example. An integrated circuit 10 according to an example may include a power amplifier 100 and a signal generator 200, for example. In addition, the device 1 may include the integrated circuit 10 and the antenna 20, for example. The device 1 may be a mobile terminal such as a smart phone, or may be other devices that have a function of wirelessly transmitting signals.

The integrated circuit 10 may output an output signal OUT to the antenna 20. The integrated circuit 10 may be a frontend module. Additionally, the output signal OUT may be a signal generated through a carrier aggregation technique that uses two or more frequency bands simultaneously.

The power amplifier 100 may receive and amplify an input signal IN received from the signal generator 200 and output the output signal OUT to the antenna 20. Each of the input signal IN and the output signal OUT may be a high frequency signal, for example, a radio frequency (RF) signal. Further specific operation and configuration of the power amplifier 100 will be described later.

The signal generator 200 may generate a signal and output the generated signal to the power amplifier 100 as input signal IN. The signal generator 200 may modulate a carrier signal based on a signal including information to be transmitted, thereby generating the input signal (IN).

The antenna 20 may receive the output signal OUT from the integrated circuit 10 and may wirelessly transmit the output signal OUT.

Figure 2:
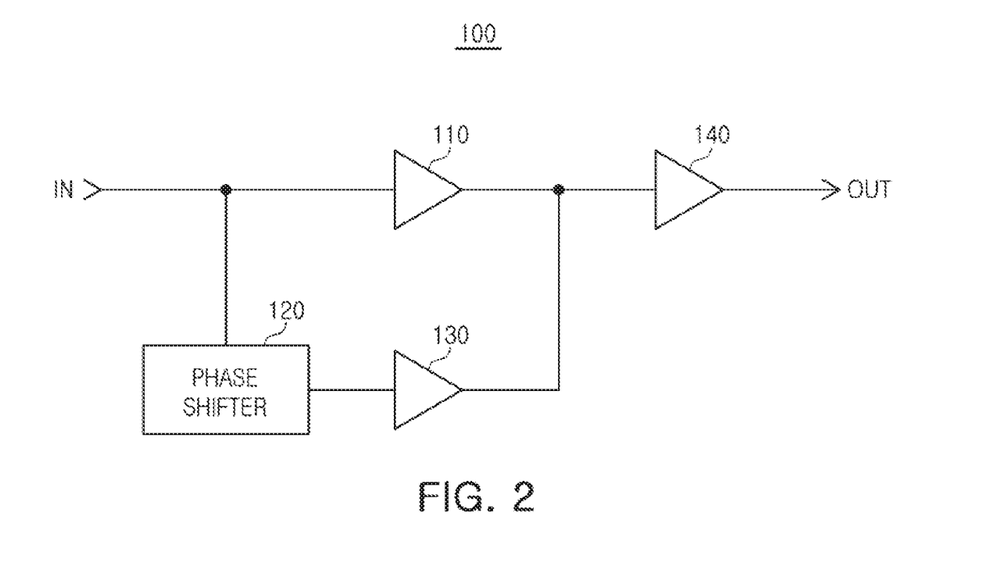
FIG. 2 is a block diagram schematically illustrating an example of a configuration of a power amplifier according to the present disclosure.

FIG. 2 is a block diagram schematically illustrating an example of a configuration of a power amplifier, e.g., the power amplifier 100 according to an example of the present disclosure. The power amplifier 100 may include a first amplifier 110, a phase shifter 120, a harmonic sinker 130, and a second amplifier 140, for example. Although the example illustrated in FIG. 1 shows a single phase shifter 120 and a single harmonic sinker 130, this is only an example, and the power amplifier 100 may include multiple amplifiers, phase shifters, and harmonic shifters.

The first amplifier 110 may amplify and output the input signal IN. The first amplifier 110 may operate relatively linearly over the harmonic sinker 130. That is, a conduction angle of the first amplifier 110 may be greater than a conduction angle of the harmonic sinker 130. For example, the first amplifier 110 may operate as a class A amplifier or a class AB amplifier. To this end, a bias current of the first amplifier 110 may be appropriately adjusted. Specifically, the bias current of the first amplifier 110 may be approximately 0 through 50% of a maximum current that may be output when the first amplifier 110 performs a full swing.

The phase shifter 120 may change the phase of the input signal IN and output the phase of the input signal IN. Specifically, the phase shifter 120 may output the phase of the input signal IN by inverting the phase of the input signal IN. The phase of the output signal of the harmonic sinker 130 may have a phase difference of 180° from the phase of the first amplifier 110 based on the inversion of the phase of the input signal IN by the phase shifter 120. As a result, the harmonic sinker 130 may eliminate a signal having a desired component from the output signal of the first amplifier 110.

The harmonic sinker 130 may be connected between an output terminal of the phase shifter 120 and an output terminal of the first amplifier 110. The harmonic sinker 130 may amplify and output the output signal of the phase shifter 120, thereby eliminating harmonics components from the output signal of the first amplifier 110. The harmonic sinker 130 may operate relatively nonlinearly over the first amplifier 130. That is, the conduction angle of the harmonic sinker 130 may be smaller than the conduction angle of the first amplifier 110. For example, the harmonic sinker 130 may operate as a class B amplifier, a deep class AB amplifier or a class C amplifier, but is not limited thereto. To this end, a bias current of the harmonic sinker 130 may be appropriately adjusted. Specifically, the bias current of the harmonic sinker 130 may be set to be a very low level. The harmonic sinker 130 may operate in a nonlinear manner so that the harmonics components of the output signal of the harmonic sinker 130 may be relatively larger, thereby more efficiently eliminating the harmonics components from the output signal of the first amplifier 110. In addition, the harmonic sinker 130 may have a size relatively smaller than that of the first amplifier 110. Specifically, the harmonic sinker 130 may have a size of about 1/10 through 1/8 of the size of the first amplifier 110. Therefore, the harmonic sinker 130 may minimize a decrease in a fundamental current of the output signal of the first amplifier 110.

The second amplifier 140 may amplify the signal of the output terminal of the first amplifier 110 and output the output signal OUT. The second amplifier 140 may operate as class A or class AB.

As a result, the harmonic sinker 130 may cause only the current of the fundamental component of the output signal of the first amplifier 110 to be input to the second amplifier 140, such that the harmonics components of the output signal OUT may be minimized.

The harmonic sinker 130 may sink the harmonics components at the output terminal of the first amplifier 110, thereby preventing the harmonics components generated in the first amplifier 110 from flowing into the second amplifier 140. Therefore, the harmonics components may be eliminated from the output signal OUT. The fundamental may be transmitted to the second amplifier 140 as much as possible and amplified by the second amplifier 140 so that a current loss of the fundamental component in the output signal OUT may be minimized.

In an example, the power amplifier 100 according to the present disclosure may only include the first amplifier without the second amplifier 140.

Figure 3:
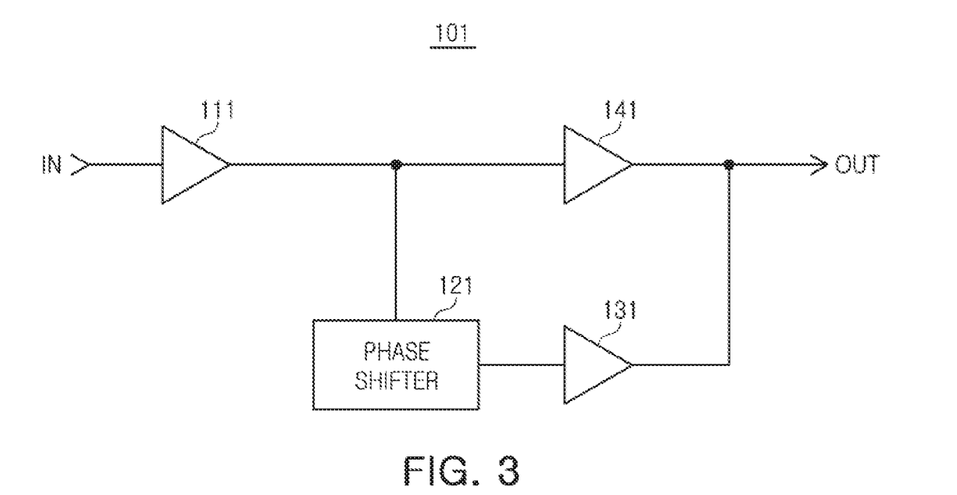
FIG. 3 is a block diagram schematically illustrating a configuration of a power amplifier according to an example of the present disclosure.

FIG. 3 is a block diagram schematically illustrating an example of the configuration of a power amplifier 101 according to the present disclosure. The power amplifier 101 may include the first amplifier 111, the phase shifter 121, the harmonic sinker 131, and the second amplifier 141.

The first amplifier 111 may amplify and output the input signal IN. The first amplifier 111 may operate as a class A amplifier or a class AB amplifier, but is not limited thereto.

The phase shifter 121 may change and output the phase of the output signal of the first amplifier 111. Specifically, the phase shifter 121 may invert and output the phase of the output signal of the first amplifier 111. The phase of the output signal of the harmonic sinker 131 may have a phase difference of 180° from the phase of the second amplifier 141 by the phase shifter 121. As a result, the harmonic sinker 131 may eliminate a signal having a desired component from the output signal of the second amplifier 141.

The harmonic sinker 131 may be connected between an output terminal of the phase shifter 121 and an output terminal of the second amplifier 141. The harmonic sinker 131 may amplify and output the output signal of the phase shifter 121, thereby eliminating harmonics components from the output signal of the second amplifier 141. The harmonic sinker 131 may operate relatively nonlinearly over the second amplifier 141. That is, the conduction angle of the harmonic sinker 131 may be smaller than the conduction angle of the second amplifier 141. For example, the harmonic sinker 131 may operate as a class B amplifier or a deep class AB amplifier, but is not limited thereto. To this end, the bias current of the harmonic sinker 131 may be appropriately adjusted. Specifically, the bias current of the harmonic sinker 131 may be set to be a very low level. The harmonic sinker 131 may operate in a nonlinear manner so that the harmonics components of the output signal of the harmonic sinker 131 may be relatively larger, thereby more efficiently eliminating the harmonics components from the output signal of the second amplifier 141. In addition, the harmonic sinker 131 may have a size relatively smaller than that of the second amplifier 141. Specifically, the harmonic sinker 131 may have a size of about 1/10 through 1/8 of the size of the second amplifier 141. Therefore, the harmonic sinker 131 may minimize the decrease in the fundamental current of the output signal of the second amplifier 141.

The second amplifier 141 may amplify and output the signal of the output terminal of the first amplifier 111. The second amplifier 141 may operate relatively linearly over the harmonic sinker 131. That is, a conduction angle of the second amplifier 141 may be greater than the conduction angle of the harmonic sinker 131. For example, the second amplifier 141 may operate as a class A amplifier or a class AB amplifier, but is not limited thereto. To this end, a bias current of the second amplifier 141 may be appropriately adjusted. Specifically, the bias current of the second amplifier 141 may be about 0 through 50% of a maximum current that may be output when the second amplifier 141 performs a full swing.

As a result, the harmonic sinker 131 may minimize the harmonics components of the output signal OUT.

The harmonic sinker 131 may sink the harmonics components at the output terminal of the second amplifier 141, thereby more effectively eliminating the harmonics components generated in the second amplifier 141 itself.

In an example, the power amplifier may include the first amplifier for amplifying the input signal and the second amplifier for amplifying the signal of the output terminal of the first amplifier and outputting the output signal which are each connected to the phase shifter and the harmonic sinker.

Figure 4:
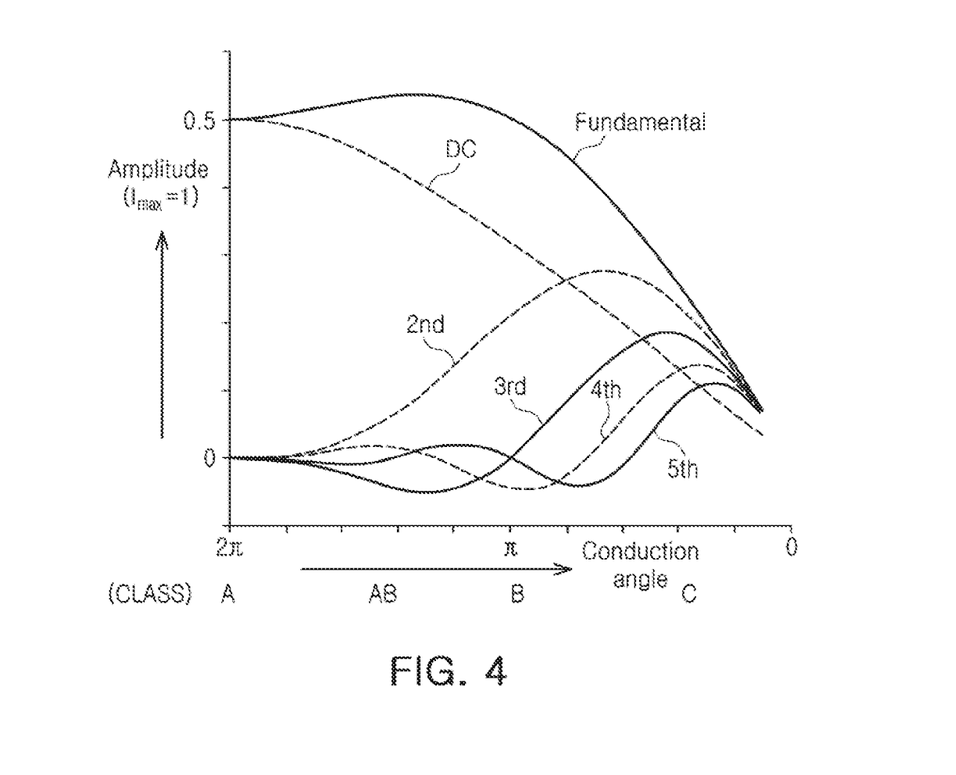
FIG. 4 is a diagram illustrating an example of an operation of a power amplifier according to the present disclosure.

FIG. 4 is a diagram illustrating an example of the operation of the power amplifier according to the present disclosure, and schematically illustrates the magnitude of the output component depending on the class (or conduction angle) of the amplifier. In FIG. 4, the fundamental may represent the fundamental component of the output signal of the amplifier, a direct current (DC) may represent a DC component of the output signal of the amplifier, and 2nd, 3rd, 4th, and 5th may each represent the second through fifth harmonics components, respectively. In addition, in FIG. 4, an x axis may represent the class of the conduction angle and the amplifier, and a y axis may represent that a maximum output current of the amplifier is 1, which represents the magnitude of the respective components of the output signal of the amplifier when the input current at which the amplifier is full swing is input.

All of the first amplifiers 110 and 111, the second amplifiers 140 and 141, and the harmonic sinkers 130 and 131 illustrated in FIGS. 2 and 3 may be various types of amplifiers.

As illustrated in FIG. 4, as the class of the amplifier is changed to A-AB-B-C, the fundamental and DC component decreases, or substantially decreases, but the harmonics components generally increases.

The first amplifier 110 or 111 or the second amplifier 140 or 141 may operate as a class AB amplifier in consideration of the efficiency of the amplifier. Alternatively, the first amplifiers 110 or 111 or the second amplifiers 140 or 141 may operate as a class A amplifier. In addition, as described above, to eliminate the harmonics component, the output terminals of the harmonic sinkers 130 and 131 may be connected to the output terminals of the first amplifiers 110 and 111 or the second amplifiers 140 and 141, the signals inverting the input signals of the first amplifiers 110 and 111 or the second amplifiers 140 and 141 may be input to the harmonic sinkers 130 and 131, and the harmonic sinkers 130 and 131 may operate as a class B amplifier, a deep class AB amplifier, or a class C amplifier, but are not limited thereto. (That is, the conduction angle of the harmonic sinkers 130 and 131 may be set to be smaller than that of the first amplifiers 110 and 111 or the second amplifiers 140 and 141). The class (or conduction angle) of the harmonic sinkers 130 and 131 may be appropriately selected in consideration of the harmonic components to be eliminated and operational characteristics of the first amplifiers 110 and 111 or the second amplifiers 140 and 141.

Additionally, to prevent the fundamental of the output signals of the first amplifier 110 and 111 or the second amplifiers 140 and 141 from being excessively attenuated, the size of the harmonic sinkers 130 and 131 may be designed to have a size smaller than the size of the first amplifiers 110 and 111 or the second amplifiers 140 and 141.

Figure 5:
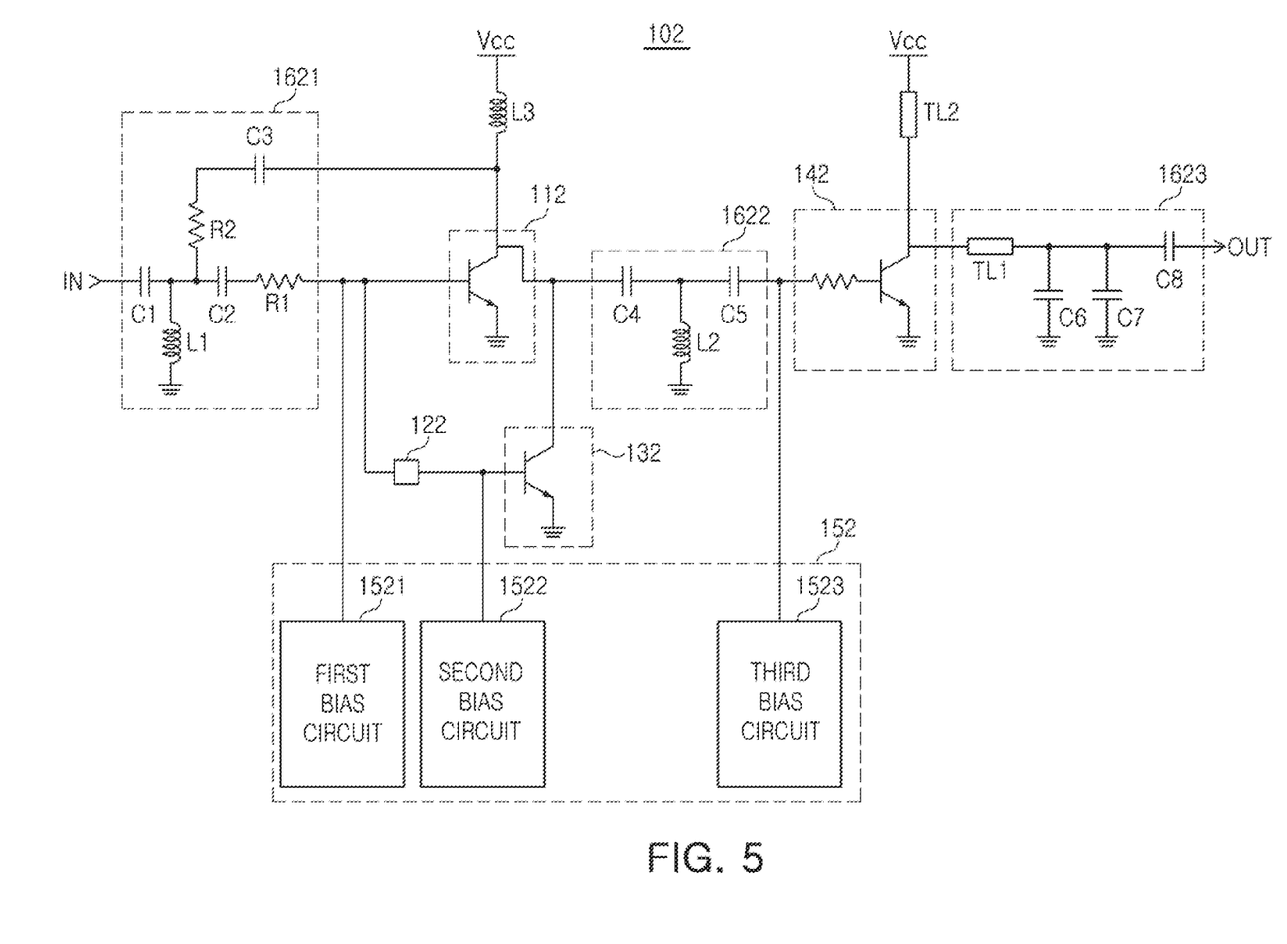
FIG. 5 is a diagram schematically illustrating a configuration of a power amplifier according to an example of the present disclosure.

FIG. 5 is a block diagram schematically illustrating an example of the configuration of the power amplifier according to the present disclosure. The power amplifier 102 may include the first amplifier 112, the phase shifter 122, the harmonic sinker 132, the second amplifier 142, a bias unit 152, and a plurality of network matching units 1621, 1622, and 1623, for example.

The first amplifier 112 may amplify and output the input signal IN. The first amplifier 112 may include a transistor including a base to which the input signal IN is applied, an emitter connected to a ground, and a collector outputting the signal obtained by amplifying the input signal IN. That is, the first amplifier 112 may be a common emitter amplifier. The first amplifier 112 may operate relatively linearly over the harmonic sinker 132. That is, the conduction angle of the first amplifier 112 may be greater than that of the harmonic sinker 132. For example, the first amplifier 112 may operate as the class A or the class AB.

A first bias circuit 1521 of the bias unit 152 may output the bias current to the first amplifier 112. That is, an operating point of the first amplifier 112 may be determined by the bias current output from the first bias circuit 1521.

The phase shifter 122 may output the phase of the input signal IN by changing the phase of the input signal IN. Specifically, the phase shifter 122 may output the phase of the input signal IN by inverting the phase of the input signal IN.

The harmonic sinker 132 may be connected between the output terminal of the phase shifter 122 and the output terminal of the first amplifier 112. The harmonic sinker 132 may amplify and output the output signal of the phase shifter 122, thereby eliminating the harmonics components from the output signal of the first amplifier 112. The harmonic sinker 132 may include a transistor including a base to which the output signal of the phase shifter 122 is applied, an emitter connected to a ground, and a collector (e.g., the collector of the first amplifier 112) connected to the output terminal of the first amplifier 112. That is, the harmonic sinker 132 may be the common emitter amplifier. In an example, the first amplifier 112 and the harmonic sinker 132 may have a form in which the first amplifier 112 shares one collector terminal with the harmonic sinker 132.

The harmonic sinker 132 may operate relatively nonlinearly over the first amplifier 112. That is, the conduction angle of the harmonic sinker 132 may be smaller than that of the first amplifier 112. For example, the harmonic sinker 132 may operate as a class B amplifier, a deep class AB amplifier or a class C amplifier, but is not limited thereto. To this end, the bias current of the harmonic sinker 132 may be appropriately adjusted.

A second bias circuit 1522 of the bias unit 152 may output the bias current to the harmonic sinker 132. That is, an operating point of the harmonic sinker 132 may be determined by the bias current output from the second bias circuit 1522.

In addition, the harmonic sinker 132 may have a size relatively smaller than the size of the first amplifier 112. Specifically, the harmonic sinker 112 may have a size of about 1/10 through 1/8 of the size of the first amplifier 110.

The second amplifier 142 may amplify the signal from the output terminal of the first amplifier 112 and output the output signal OUT. The second amplifier 142 may operate as the class A or the class AB. That is, the second amplifier 142 may be the common emitter amplifier. To this end, the bias current of the second amplifier 142 may be appropriately adjusted.

A third bias circuit 1523 of the bias unit 152 may output the bias current to the second amplifier 143. That is, an operating point of the second amplifier 142 may be determined by the bias current output from the third bias circuit 1523.

The first bias circuit 1521, the second bias circuit 1522, and the third bias circuit 1523 of the bias unit 152 may each operate independently of each other. That is, each of the first bias circuit 1521, the second bias circuit 1522, and the third bias circuit 1523 may be designed to be affected by the operations of other bias circuits.

Each of the plurality of network matching units 1621, 1622, and 1623 may include a plurality of passive elements, and match the impedances of a front end and a rear end thereof with each other.

As illustrated in FIG. 5, the power amplifier according to an example of the present disclosure may further include an inductor L3 and/or a transmission line TL2.

Each of the inductor L3 and the transmission line TL2 may serve to prevent the loss of the output signals of each of the first amplifier 112 and the second amplifier 142 simultaneously with smoothly supplying power to each of the first amplifier 112 and the second amplifier 142.

Some of the components of FIG. 5 may be omitted based on the operational posture of the integrated circuit.

According to the examples in the present disclosure, the harmonic sinkers 130, 131 and 132 may sink the harmonic current corresponding to the frequency of the input signal IN from the output terminals of the first amplifiers 110, 111, and 112 and/or the second amplifiers 140, 141, and 142 to the ground. Therefore, the harmonics components may be eliminated over the wideband. Additionally, the harmonic sinkers 130, 131, and 132 may have the shape similar to that of the amplifier and occupy a relatively smaller area, such that the harmonic sinkers 130, 131, and 132 may be easily implemented as an on chip. As a result, there is no additional cost or area consumption for the harmonics elimination.

As set forth above, according to the examples in the present disclosure, the power amplifier and the integrated circuit including the same may eliminate the harmonic component of the signal to be transmitted in a wideband.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier, comprising:
a first amplifier configured to amplify a first signal;
a phase shifter configured to invert the first signal; and
a harmonic sinker connected between an output terminal of the phase shifter and an output terminal of the first amplifier and having a conduction angle narrower than a conduction angle of the first amplifier,
wherein the harmonic sinker is configured to amplify an output signal of the phase shifter, and generate a signal that eliminates a harmonic component from a signal from the output terminal of the first amplifier.

2. The power amplifier of claim 1, wherein the first amplifier is one of a class A amplifier and a class AB amplifier, and
the first harmonic sinker is one of a deep class AB amplifier, a class B amplifier, and a class C amplifier.

3. The power amplifier of claim 1, further comprising:
a second amplifier configured to amplify the signal from the output terminal of the first amplifier.

4. The power amplifier of claim 3,
wherein the phase shifter is further configured to invert the first signal from an input terminal of the first amplifier.

5. The power amplifier of claim 1, further comprising:
a second amplifier configured to receive the first signal from the first amplifier, amplify the first signal, and output the amplified first signal as a second signal.

6. The power amplifier of claim 1, wherein the first amplifier comprises a first transistor that has a first transistor base to which the first signal is applied, a first transistor emitter connected to a ground, and a first transistor collector from which a second signal obtained by amplifying the first signal is output.

7. The power amplifier of claim 6, wherein the harmonic sinker comprises a second transistor that has a second transistor base to which an output signal of the phase shifter is applied, a second transistor emitter connected to the ground, and a second transistor collector connected to an output terminal of the first amplifier.

8. The power amplifier of claim 7, wherein the first transistor shares a collector terminal with the second transistor.

9. The power amplifier of claim 1, further comprising:
a first bias circuit configured to output a first bias current to an input terminal of the first amplifier; and
a second bias circuit configured to operate independently of the first bias circuit and configured to output a second bias current to an input terminal of the harmonic sinker.

10. The power amplifier of claim 1, wherein the power amplifier is an integrated circuit, and further comprises a signal generator to signal process an input signal to generate the first signal.

11. An integrated circuit, comprising:
a signal generator configured to modulate a carrier signal based on a signal comprising information to be transmitted and output an input signal; and
a power amplifier configured to amplify the input signal and output an output signal,
wherein the power amplifier comprises:
a first amplifier configured to amplify the input signal;
a phase shifter configured to invert the input signal; and
a harmonic sinker connected between an output terminal of the phase shifter and an output terminal of the first amplifier and having a conduction angle narrower than a conduction angle of the first amplifier,
wherein the harmonic sinker is configured to amplify an output signal of the phase shifter, and generate a signal that eliminates a harmonic component from a signal from the output terminal of the first amplifier.

12. The integrated circuit of claim 11, wherein the first amplifier is one of a class A amplifier and a class AB amplifier, and
the first harmonic sinker is one of a deep class AB amplifier, a class B amplifier, and a class C amplifier.

13. The integrated circuit of claim 11, further comprising:
a second amplifier configured to amplify the signal from the output terminal of the first amplifier and output the output signal.

14. The integrated circuit of claim 13,
wherein the phase shifter is further configured to invert the input signal from an input terminal of the first amplifier.

15. The integrated circuit of claim 11, wherein the power amplifier further comprises a second amplifier configured to receive the input signal from the first amplifier, amplify the input signal, and output the amplified input signal.

16. The integrated circuit of claim 11, wherein the first amplifier comprises a first transistor that has a first transistor base to which a first signal is applied, a first transistor emitter connected to a ground, and a first transistor collector from which a second signal obtained by amplifying the first signal is output.

17. The integrated circuit of claim 16, wherein the harmonic sinker comprises a second transistor that has a second transistor base to which an output signal of the phase shifter is applied, a second transistor emitter connected to the ground, and a second transistor collector sharing a collector terminal with the first transistor collector of the first transistor.

18. A power amplifying method, the method comprising:
generating a first amplified signal by amplifying a first signal with a first amplifier;
changing a phase of the first amplified signal with a phase shifter;
generating a second amplified signal by amplifying the amplified first signal with a second amplifier; and
harmonically sinking harmonic components of the second amplified signal with a harmonic sinker having a conduction angle narrower than a conduction angle of the first amplifier,
wherein the harmonically sinking of the harmonic components comprises eliminating signals that have a predetermined harmonic component from the second amplified signal.

19. The power amplifying method of claim 18, wherein the changing of the phase of the first amplified signal comprises inverting an output signal of the first amplifier for provision of the inverted output signal to the harmonic sinker.

20. The power amplifier of claim 1, wherein the harmonic sinker comprises a transistor that has a base to which an output signal of the phase shifter is applied, an emitter connected to a ground, and a collector connected to an output terminal of the first amplifier.

* * * * *